US007858876B2

(12) United States Patent
Lagally et al.

(10) Patent No.: US 7,858,876 B2
(45) Date of Patent: Dec. 28, 2010

(54) GRAPHITE-BASED PHOTOVOLTAIC CELLS

(75) Inventors: Max Lagally, Madison, WI (US); Feng Liu, Salt Lake City, UT (US)

(73) Assignees: Wisconsin Alumni Research Foundation, Madison, WI (US); University of Utah Research Foundation, Salt Lake City, UT (US)

( * ) Notice: Subject to any disclaimer, the term of this patent is extended or adjusted under 35 U.S.C. 154(b) by 955 days.

(21) Appl. No.: 11/685,439

(22) Filed: Mar. 13, 2007

(65) Prior Publication Data

US 2010/0132773 A1 Jun. 3, 2010

(51) Int. Cl.
*H01L 31/00* (2006.01)
*H02N 6/00* (2006.01)

(52) U.S. Cl. ............... 136/255; 136/243; 136/246; 136/259; 136/261

(58) Field of Classification Search ............ 136/243, 136/246, 255, 259, 261
See application file for complete search history.

(56) References Cited

U.S. PATENT DOCUMENTS

| 2003/0185741 | A1 | 10/2003 | Matyjaszewski |
| 2005/0166292 | A1* | 7/2005 | Lee ..................... 977/DIG. 1 |
| 2006/0196537 | A1* | 9/2006 | Narkis et al. ............ 136/255 |

2006/0272701 A1 12/2006 Ajayan et al.

FOREIGN PATENT DOCUMENTS

WO 02/081372 A2 10/2002
WO 2008/132445 A2 11/2008

OTHER PUBLICATIONS

Zhiping Xu, "Elementary building blocks of graphene-nanoribbon-based electronic devices", Applied Physics Letters/ vol. 90/ Issue 22/ Nanoscale Science and Design, 2007.
Berger, Claire, "Electronic Confinement and Coherence in Patterned Epitaxial Graphene", Science 312, 1191, May 26, 2006.
Yarris, Lynn, "Zigzag Graphene Nanoribbons: A new Path to Spintronics", Science@Berley Lab, Jan. 2007.
Geim, A.K., "The Rise of Graphene", Mar. 2007.
Obradovic, Boma, et al. "Carbon Nanoribbons: An Alternative to Carbon Nanotubes", Simulation of Semiconductor Process and Devices, 2006 International Conference, on Sep. 1, 2006.
Barone, Veronica, et al. "Electronic Structure and Stability of Semi-conducting Graphene Nanoribbons" Nano Letters, vol. 6, No. 12; Nov. 24, 2006.

(Continued)

*Primary Examiner*—Jennifer K Michener
*Assistant Examiner*—Eli S Mekhlin
(74) *Attorney, Agent, or Firm*—Bell & Manning, LLC

(57) ABSTRACT

The present invention uses lithographically patterned graphite stacks as the basic building elements of an efficient and economical photovoltaic cell. The basic design of the graphite-based photovoltaic cells includes a plurality of spatially separated graphite stacks, each comprising a plurality of vertically stacked, semiconducting graphene sheets (carbon nanoribbons) bridging electrically conductive contacts.

23 Claims, 4 Drawing Sheets

OTHER PUBLICATIONS

Lee, Ji, "Photovoltaic Effect on Ideal Carbon Nanotube Diodes" Applied Physics Letters, AIP, American Institute of Physics, Melville, NY, vol. 87, No. 7; Aug. 8, 2005.

PCT "International Search Report and Written Opinion of the Searching Authority" mailed Feb. 18, 2009.

"Efficient, Inexpensive Solar Cell Based on Lithographically Defined Graphite Nanoribbons," http://www.business.utah.edu/display.php?&pageID=1310, printed Feb. 7, 2007 (clearer version printed Mar. 16, 2007, also provided).

Obradovic et al., Analysis of graphene nanoribbons as a channel material for field-effect transistors, Applied Physics Letters, Apr. 3, 2006, pp. 142102-1-142102-3, 88-142102, American Institute of Physics, U.S.A.

\* cited by examiner

GRAPHITE-BASED PHOTOVOLTAIC CELLS

STATEMENT OF GOVERNMENT RIGHTS

This invention was made with United States government support awarded by the following agency: Department of Energy under grant number DE-FG02-03ER46028. The United States government has certain rights in this invention.

BACKGROUND OF THE INVENTION

Photovoltaic cells convert sunlight directly into electricity through the interaction of photons and electrons within a photoconducting material. To create a photovoltaic cell, a photoconducting material, commonly silicon, is joined by electrical contacts to form a junction. Presently, most silicon-based photovoltaic cells are silicon p-n junction devices. Photons striking the cell are absorbed and thus cause the formation of electron-hole pairs; electrons and holes moving in opposite directions across the junction create a current. A grid of these electrical contacts creates an array of cells from which the current is gathered. The DC current produced in the cell depends on the materials involved and the energy and intensity of the radiation incident on the cell.

Photovoltaic cells have been available for a number of years, and it has been predicted that the use of photovoltaics will continue to increase for years to come. The major obstacles to photovoltaic use throughout the world are cell efficiency and cell cost. Presently, the cost per watt for most photovoltaic cells is not low enough for these cells to be competitive with other energy sources. Currently, the industry standard solar-cell material is crystalline Si. However, bulk Si is unlikely to achieve a cost lower than $1.00/watt because of the materials-intensiveness of the process that is used to produce it. Also, the intrinsic cell efficiency of Si is limited by thermodynamics to less than ~30%.

Solar-cell efficiency is limited by both extrinsic and intrinsic factors. Extrinsic losses, such as loss due to reflection and transparency (small opacity) and incomplete collection of photogenerated carriers due to imperfect contacts and leakage, can be overcome by better design and manufacture of the cell modules. Intrinsic losses, however, must be overcome by the design of cell materials through energy band engineering. For example, even if all the extrinsic losses can be eliminated, the highest efficiency of an ideal cell made from a single material is ~31%, with an optimal band gap of ~1.35 eV (C. H. Henry, *J. Appl. Phys.* 51, 4494 (1980)), because solar photons with an energy smaller than the band gap cannot be adsorbed, while energy dissipation due to thermalization of generated electrons and holes for photons with higher energies can produce heat and thus waste energy. One strategy for improving cell efficiency is to use combinations of materials having multiple band gaps. The highest cell efficiency—close to 40%—has been achieved by multi-junction cells made from III-V and Ge thin films. However, these high-efficiency research cells are too expensive to penetrate the general power market.

More recently, a Schottky barrier cell based on single-walled carbon nanotubes has been proposed. However, inexpensive production of such cells may not be possible.

Thus, new materials are needed to increase cell efficiency and reduce cell cost to reach the goal of a production cost of less than $0.50/watt.

SUMMARY OF THE INVENTION

The present invention encompasses graphite-based photovoltaic cells and methods for generating electricity from these cells. In these photovoltaic cells, spatially separated stacks of graphite, each comprising a plurality of vertically stacked semiconducting graphene sheets, serve as a photovoltaic material bridging electrical contacts. The graphene sheets, or "nanoribbons," have nanoscale-width dimensions such that the band gap of each sheet depends on the width of the sheet. Thus, by incorporating graphene sheets having different widths, and thereby different band gaps, into the photovoltaic cell, the cell can be designed to absorb efficiently across the solar spectrum. The result is a photovoltaic cell that is efficient and inexpensive to manufacture.

In a basic embodiment, the photovoltaic cell includes a first contact (or a set of first contacts) comprising a first electrically conductive material with which the nanoribbons in the graphite stacks form a Schottky barrier (either for electrons or for holes); and a second contact (or a set of second contacts) comprising a second electrically conductive material with which the nanoribbons in the graphite stacks either form smaller Schottky barriers for the same carrier, do not form a Schottky barrier at all, or form a Schottky barrier for the opposite carrier. In one version of a Schottky barrier cell, the first electrically conductive material, typically a metal, has a lower work function than the nanoribbons. As a result, the junctions formed between the first electrically conducting material and the nanoribbons are characterized in that they form Schottky barriers for electrons. The second electrically conductive material may have a work function close to that of the nanoribbons, such that no Schottky barrier is formed at the junction. Alternatively, the junctions formed between the second electrically conducting material and the nanoribbons may be characterized by their formation of Schottky barriers for electrons that are smaller than those formed at the junctions between the first electrically conducting material and the nanoribbons. In yet another alternative variation, Schottky barriers for holes are formed at the junctions between the second electrically conductive material and the nanoribbons. In this variation, the second electrically conductive material is selected such that it has a higher work function than the nanoribbons.

The photovoltaic cell may be used to generate electricity by exposing the photovoltaic cell to radiation capable of photogenerating charge carriers in the graphene sheets (e.g., solar radiation), whereby electricity is produced. The electricity may then be transmitted to a storage device or a consuming device.

Further objects, features, and advantages of the invention will be apparent from the following detailed description when taken in conjunction with the accompanying drawings.

DETAILED DESCRIPTION OF THE PREFERRED EMBODIMENTS

The present invention uses lithographically patterned graphite stacks as the basic building elements of efficient and economical photovoltaic cells. The basic design of the graphite-based photovoltaic cells includes a plurality of spatially separated graphite stacks, each comprising a plurality of vertically stacked semiconducting graphene sheets (carbon nanoribbons) bridging electrically conductive contacts. The contact materials, which are typically two different metals, have different work functions in Schottky contact with the nanoribbons of the graphite stacks, which generates a built-in potential in the nanoribbons.

Figure 1:
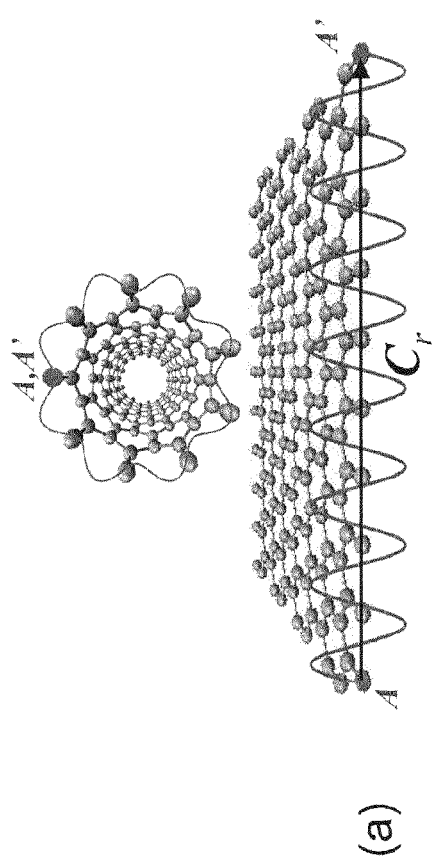
FIG. 1(a) is a diagram showing the electron confinement in a carbon nanotube (1(a)—upper panel) and a carbon nanoribbon (1(a)—lower panel).
FIGS. 1(b)-(e) are schematic illustrations of carbon nanoribbons having an asymmetric armchair configuration (1(b)); a symmetric zigzag configuration (1(c)); a symmetric armchair configuration (1(d)); and an asymmetric zigzag configuration (1(e)). The vertical stripes in (c) and (d) indicate cutting off a row of atoms on the right edge relative to those in (a) and (b), respectively.
Figure 1:
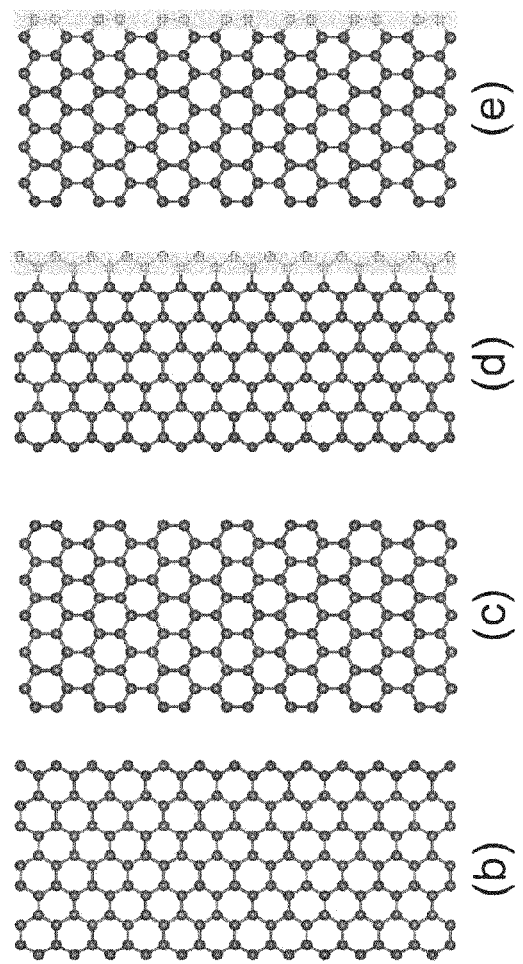

The present photovoltaic cells take advantage of the fact that the electronic properties of patterned nanoribbons exhibit a dependence on the nanoribbon direction (chirality) and width that is analogous to the dependence of the electronic properties of single-walled carbon nanotubes (SWNT) on tube diameter and chirality. A nanotube is often viewed as a rolled-up piece of graphene (a single sheet of graphite); conversely, a nanoribbon may be thought of as an unrolled nanotube. The electron confinement, the physical origin that gives rise to the differentiation of semiconducting and metallic behavior, is equivalent in the tube and ribbon configurations, as illustrated in FIG. 1(a). In both cases, the electrons are confined to form standing waves along $C_r$, the wrapping (rolling) vector of an SWNT, albeit with slightly different boundary conditions. In the nanoribbon, two nodal points of the confined electron wave must be at the ribbon edge (lower panel of FIG. 1(a)), while in an SWNT they can be anywhere, i.e., a circumferential periodic boundary condition, as illustrated in the upper panel of FIG. 1(a).

The direction of a nanoribbon determines whether it is metallic or semiconducting. This is particularly relevant for photovoltaic applications, where semiconducting nanoribbons are necessary. The "direction" of a nanoribbon may be realized by considering ways of cutting through a graphene sheet. By cutting through the graphene sheet along two rows of C—C bonds, nanoribbons of different "chiralities" such as armchair (FIGS. 1(b) and 1(d)) and zigzag (FIGS. 1(c) and 1(e)) nanoribbons can be created, depending on the direction of the cuts. Also for the given "chirality", there are two classes of nanoribbons with either a left-right symmetric edge structure (FIGS. 1(c) and 1(d), with the blue panel removed) or a left-right asymmetric edge structure (FIGS. 1(b) and 1(e), with the blue panel removed).

Importantly, all armchair and one-third of the zigzag symmetric nanoribbons are metallic, while two-thirds of zigzag nanoribbons are semiconducting. This is in the same ratio as single-walled carbon nanotubes.

Especially useful for photovoltaic applications is the fact that two-thirds of zigzag nanoribbons behave as semiconductors with a finite band gap. These provide a new class of nanomaterials (nanoscale semiconductors) that are well-suited for use as building blocks for fabricating the present photovoltaic cells. Because the band gaps of the nanoribbons increase continuously with decreasing ribbon width, graphite stacks having a variety of widths, and therefore comprising nanoribbons having different band gaps, can be incorporated into a photovoltaic cell to provide a photovoltaic cell that absorbs at wavelengths across the full spectrum of solar radiation. For example, the photovoltaic cell can include nanoribbons having band gaps spanning the range of about 0.1 eV to about 2 eV. This could be accomplished by using graphite stacks having different widths in the range of about 30 nm to about 1 nm (e.g., about 20 nm to about 2.5 nm).

Another useful characteristic of the nanoribbons is that their work functions are not strongly dependent upon their widths. First-principles calculations indicate that all of the zigzag and armchair carbon nanoribbons have a work function of about 4.58 eV, which is only slightly lower than the work function of an infinite single sheet of graphene (4.66 eV). This behavior is drastically different from that of SWNTs, where the curvature effect induces a surface dipole that changes the work function of an SWNT, making it dependent on tube diameter. The independence of the work function of the carbon nanoribbons from their width is a technologically useful feature for designing carbon nanoribbon-based solar cells. When carbon nanoribbons of different sizes are placed in contact with a metal lead, the same magnitude of contact potential (or Schottky barrier) will be generated at all the contacts, independent of carbon nanoribbon size. Thus, for the present Schottky barrier photovoltaic cells, the same overall built-in potential will be generated across all of the carbon nanoribbons bridging two electrically conductive contacts in a multiple-gap cell architecture.

Figure 2:
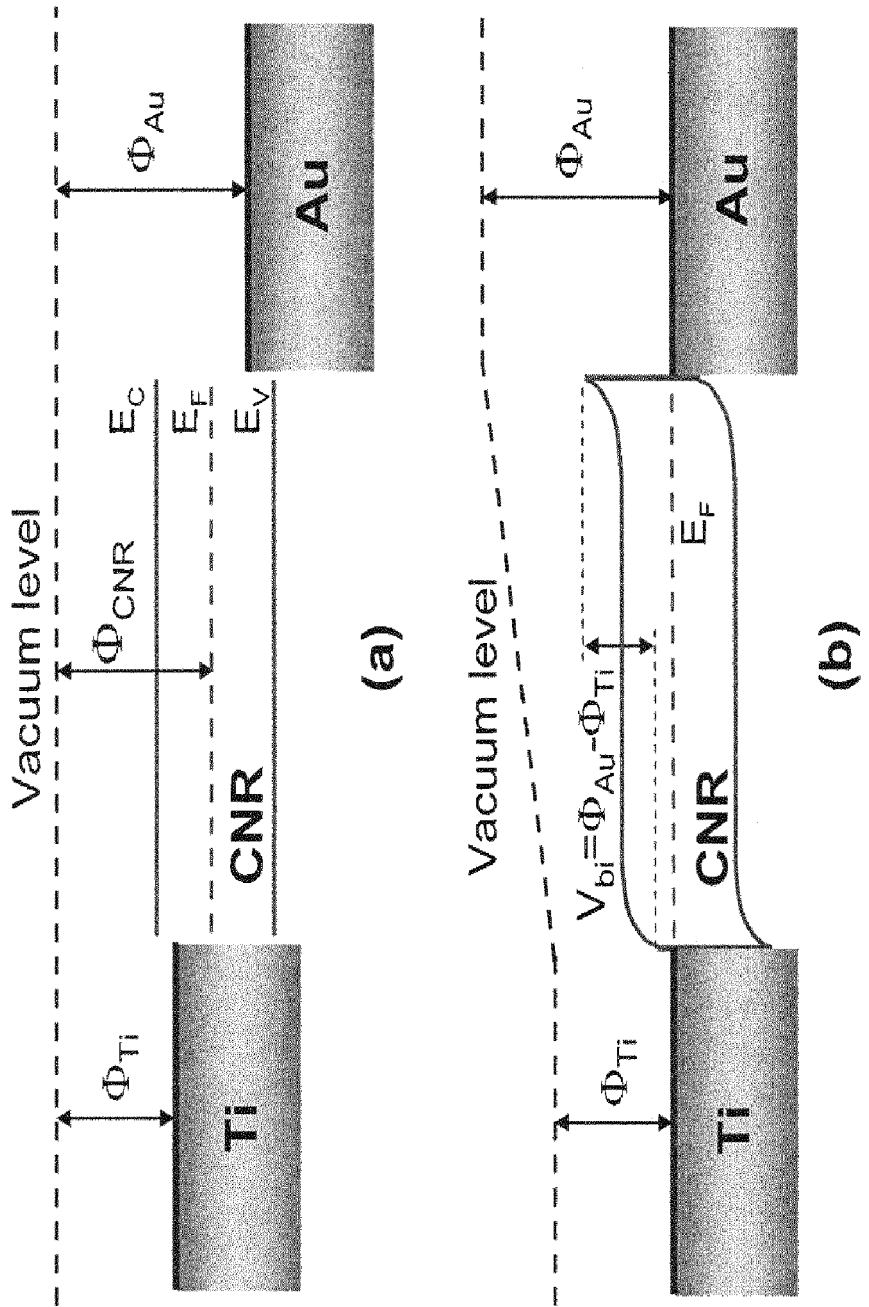
FIG. 2 shows a schematic energy level diagram of a titanium contact; a carbon nanoribbon; and a gold contact before contact is made (2(a)), and in contact with the three materials (2(b)).

By way of illustration, FIG. 2 is a schematic diagram of a titanium contact-carbon nanoribbon-Au contact (Ti—CNR—Au) device in accordance with the present invention. In this device design one metal lead (Ti) has a work function (4.3 eV) smaller than that of the nanoribbon and the other metal lead (Au) has a work function (5.1 eV) larger than that of the nanoribbon. FIG. 2(a) shows the energy band diagrams of each material in the Ti—CNR—Au device before contact, where the Fermi levels of the materials are misaligned by their work function differences. When the three materials are brought into contact (FIG. 2(b)), their Fermi levels must line up. As a result, an electric field is generated in the carbon nanoribbon, with a built-in potential ($V_{bi}$) that equals the work function difference between the two metal leads, as shown in FIG. 2(b). For the ideal case of a short intrinsic nanoribbon, $V_{bi}$ may decrease linearly over the whole nanoribbon from the Au contact to the Ti contact, like the vacuum level shown schematically in FIG. 2(b). For a very long and doped nanoribbon, the doping level may be pinned, or the Fermi energy of the nanoribbon will remain constant in the middle portion of the nanoribbon. Then, in this case, the conduction and valence bands will be flat in the middle portion of the nanoribbon, but bend downward near the Ti contact and upward near the Au contact, respectively, as illustrated in FIG. 2(b). The built-in field can separate electron-hole pairs generated by incident photons, creating a current.

A typical graphite-based Schottky barrier photovoltaic cell in accordance with the present invention may include billions (or even trillions) of nanoribbons, depending on the density and dimensions of the graphite stacks. A working graphite nanoribbon photovoltaic cell could be designed to contain as high as possible a packing density of ribbons to increase opacity, such as $10^8/cm^2$ packed $10^4$ deep, so as to achieve the highest power density. The maximum power density of solar illumination is ~850 W/m² without a solar concentrator.

The present photovoltaic cells may produce power densities of 50 W/m², or higher, even without a solar concentrator. Of course, a solar concentrator can be used to improve the power density. For example, using a 100× solar concentrator, a power density of 5000 W/m² may be achieved.

Figure 3:
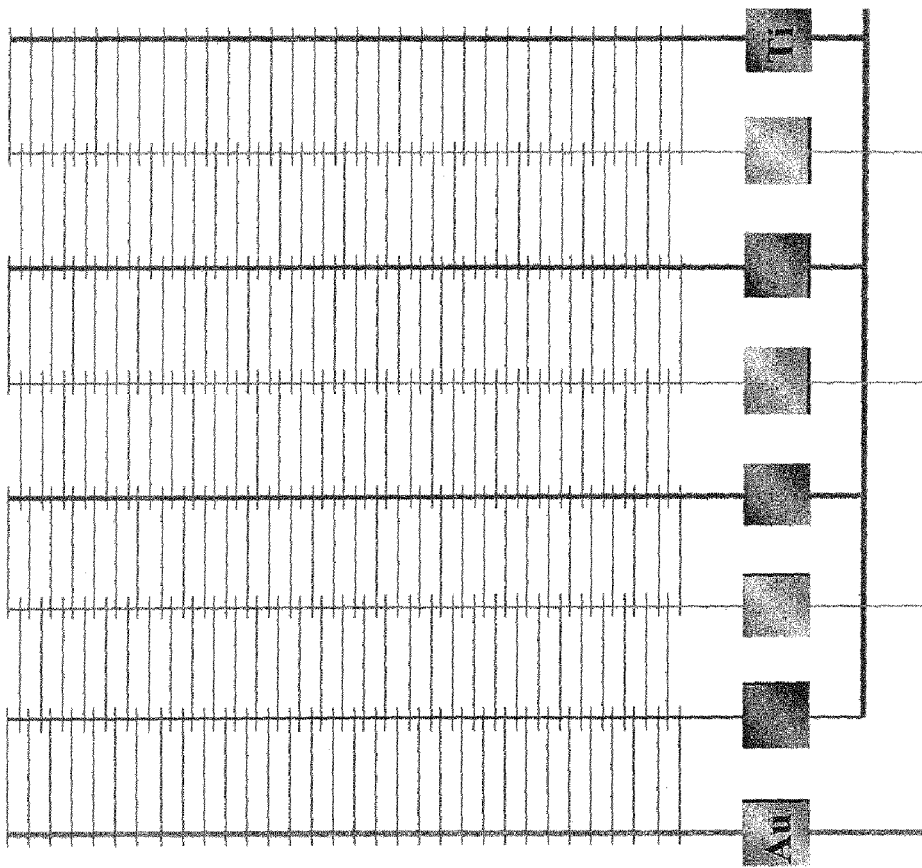
FIG. 3 shows a schematic diagram of a top view of a graphite-based Schottky barrier photovoltaic cell. Each vertical line in the figure represents one stack of nanoribbons.

A schematic diagram of a graphite-based Schottky barrier photovoltaic cell is shown in FIG. 3. The cell includes of a large array of graphite stacks (each line in the figure represents a graphite stack containing, for example, about >$10^4$ vertically stacked nanoribbons) connected between metal electrodes to form Schottky contacts. Each stack is contacted by two metal contacts (e.g., one Ti contact and one Au contact). Each row generates a photocurrent (or photovoltage) and can be wired to match a required use. One readout can serve all layers of graphene in a graphite stack, as the individual graphene layers are naturally independent in graphite. The resulting Schottky barrier photovoltaic cell operates in the same manner as a typical photovoltaic cell. A photon excites an electron from the valence band into the conduction band. An electron-hole pair generated by this action feels the field set up by the difference in work functions between the two metal contacts and the nanoribbon, and the electron and hole become separated. The cells can be wired to either increase the current, or increase the voltage, just as in a conventional photovoltaic cell.

The photovoltaic cells may be made using semiconductor processing techniques, such as lithography, patterning, and etching. This is advantageous because it provides an inexpensive parallel process capable of making many identical or different stacks in a single run. The basic method for forming a plurality of stacks includes patterning a plurality (e.g., an array) of stacks on a high-purity graphite substrate, then etching through the substrate to a depth of hundreds of microns using an oxygen plasma. For example, graphite stacks may be prepared from commercially available 0.2-mm thin strips of highly-oriented pyrolytic graphite (HOPG) (SPI products HOPG Graded 1). (Thinner or thicker layers of graphite may be used. However, the graphite substrate is desirably thin enough to be flexible.) The HOPG thin film may be transferred to a handle substrate, as described in Novoselov et al., *Science* 306, 666 (2004). For a photovoltaic device, an insulating handle substrate is desirable; therefore, an oxidized Si wafer with a thick $SiO_2$ film (~300 nm) may be utilized as a substrate. Alternately, to make a flexible and less expensive cell, a flexible polymer, such as PET, may be used as the handle substrate. An SU8 photoresist may be used to bond the graphite to the PET film. (See, for example, Yuan et al., *J. Appl. Phys.* 100, 013708 (2006).)

Figure 4:
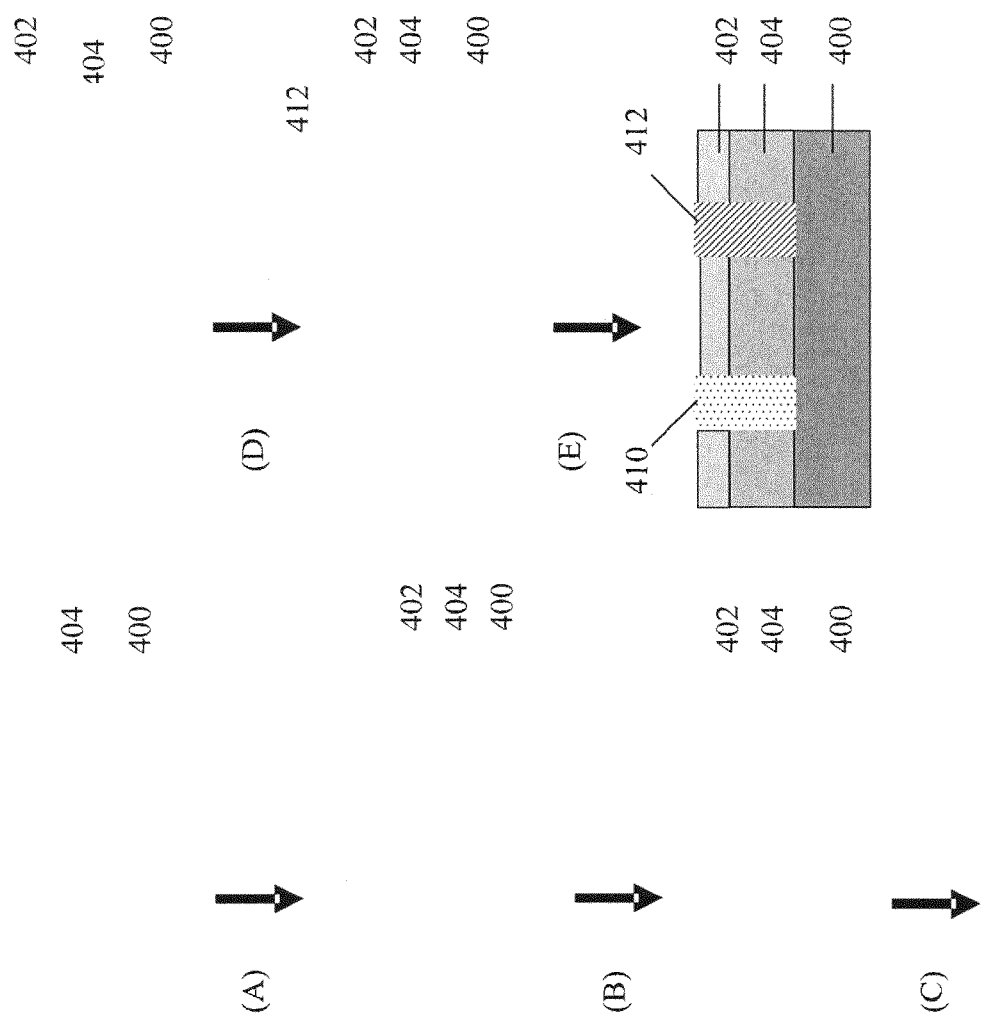
FIG. 4 shows a fabrication sequence for forming a photovoltaic cell on a graphite substrate.

The desired nanoribbon geometry can be tailored by nanopatterning and etching the graphite thin film. An illustration of a fabrication sequence is provided in FIG. 4. A 200-nm-thick $SiO_2$ film (402), serving as an etch stop mask, is first deposited on an HOPG surface (404) with plasma-enhanced chemical vapor deposition (PECVD). The HOPG surface is supported by a handle substrate (400). A resist material (406), such as polymethylmethacrylate (PMMA), is coated over the etch stop (step A). A high-resolution lithographic technique, such as EUV or UV laser interference lithography or nanoimprint lithography, is then used to create a pattern in the resist that will provide an array of spatially separated graphite stacks. The exposed oxide is then removed by anisotropic dry etching (e.g., $SiO_2$ dry etching) to obtain a steep sidewall, i.e., to prevent the undercut occurring in wet etching (step B). The graphite film is then etched using an oxygen plasma to form trenches (408) of the appropriate depth (step C). The widths of the trenches can be selected based upon the desired band gaps of the nanoribbons. Once the trenches are formed in the graphite film, electron beam evaporation, or another suitable metal deposition technique, may be used to deposit the Ti (410) and Au (412) (step D) and advanced lift-off procedures may be used to define the contacts (step E). Optionally, the spaces (e.g., trenches) along the long sides of the nanoribbons (i.e., along their lengths) may be filled with a passivating polymer in order to prevent the edges of the nanoribbons from reacting with oxygen or other environmental vapors (e.g., $H_2O$, $N_2$, etc.).

The use of lithographic techniques in forming the graphite stacks is advantageous because it allows for the selective formation of semiconducting nanoribbons, rather than metallic nanoribbons. The selective formation of semiconducting nanoribbons may be accomplished by using the proper direction of patterning to provide graphene sheets having symmetric zigzag configurations, asymmetric zigzag configurations, or a combination thereof. Depending upon the lithographic technique used, it may be impractical or impossible to form graphite stacks that do not contain any metallic zigzag nanoribbons. In such situations, the metallic nanoribbons may be eliminated in a separate processing step. For example, the metallic nanoribbons can be converted into semiconducting nanoribbons by burning in a manner similar to that used with carbon nanotubes. (See, for example, Collins et al., *Science* 292, 706 (2001).) In this method, a graphite stack is gated to render the semiconducting nanoribbons non-conductive and a current is run through the stack to "burn" the metallic nanoribbons until their size is reduced sufficiently to render them semiconducting. Alternatively, the edges of the metallic nanoribbons could be doped to render them semiconducting.

Thus, in some embodiments it is desirable for part or all of the nanoribbons in the graphite stacks to be selectively doped. For example, a p-n junction can be created by doping with different dopants in two different segments of a nanoribbon. One effective way to dope nanoribbons is by manipulating their edge structures with different terminations. For example, the nanoribbons would be n-type doped if terminated with group-V elements such as phosphorus (P) and arsenic (As) and or p-type doped if terminated with group-III elements such as boron (B) and gallium (Ga). The nanoribbon termination can be modified by flowing molecular precursors containing the required dopant atom, such as phosphine ($PH_3$) for doping P and arsine ($AsH_3$) for doping As, to the bare nanoribbon.

Typical dimensions for the lithographically-defined stacks are about 100 μm to about 300 μm in height, about 2 nm to about 30 nm in width and about 0.1 μm to about 1000 μm in length. Typical stack densities on a substrate are about $10^6$ to about $10^{12}$ stacks/$cm^2$. Photovoltaic cells utilizing these stack dimensions could contain $10^{12}$ graphene sheets per $cm^2$.

Within a lithographically-defined graphite stack, there may be some minor variation in the widths of the vertically-stacked nanoribbons. This variation will depend on the limits of the patterning and etching procedures used. Thus, the nanoribbons in a graphite stack having non-uniform widths, wherein the non-uniformity is created by limitations of the lithographic technique, will be considered to have "substantially identical widths" and, therefore, "substantially identical bandgaps." For example, graphite stacks or nanoribbons may be considered as having "substantially identical widths" if their widths vary by less than about 0.2 nm.

The graphite stacks may be formed on a graphite substrate in a regular array or pattern. It is desirable to include graphite stacks having different widths in the photovoltaic cells in order to produce cells that absorb radiation at different wavelengths. The widths are desirably selected to provide a cell that absorbs at wavelengths across the solar spectrum (e.g., from about 0.1 eV to about 2 eV). For example, a photovoltaic cell may include a plurality (e.g., three or more) of regions, wherein a region is defined as a plurality of graphite stacks having identical or substantially identical widths. The graphite stacks in each region may be spatially grouped (i.e., adjacent) or may be separated by graphite stacks from other regions. The different regions may then be connected in series to provide a photovoltaic cell.

Once a plurality, or array, of stacks is formed on a substrate, alternating Au and Ti (or other appropriate conductive material) contacts are deposited in the trenches. Because the nanoribbons are much longer than they are wide, the metal patterning and deposition may be carried out using conventional deposition techniques. The resulting contacts will connect the nanoribbons at all layers of a given graphite stack.

As used herein and unless otherwise specified, "a" or "an" means "one or more." All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is understood that the invention is not confined to the particular embodiments set forth herein as illustrative, but embraces all such forms thereof as come within the scope of the following claims.

What is claimed is:

1. A photovoltaic cell comprising:
   (a) a first contact comprising a first electrically conductive contact material;
   (b) a second contact comprising a second electrically conductive material; and
   (c) a plurality of spatially separated graphite stacks bridging the first and second contacts, each graphite stack comprising a plurality of vertically stacked, semiconducting graphene sheets;
   wherein junctions between the first electrically conductive material and the graphene sheets form Schottky barriers for electrons or holes.

2. The photovoltaic cell of claim 1, wherein the graphite stacks have widths of no greater than 50 nm.

3. The photovoltaic cell of claim 1, wherein the graphite stacks have widths of no greater than 30 nm.

4. The photovoltaic cell of claim 3, wherein the graphite stacks have widths of about 2 nm to about 25 nm.

5. The photovoltaic cell of claim 4, wherein the graphene sheets in the graphite stacks have bandgaps spanning the range of about 0.1 eV to about 2 eV.

6. The photovoltaic cell of claim 1, wherein the graphite stacks have heights of about 100 µm to about 300 µm.

7. The photovoltaic cell of claim 1, wherein the density of graphite stacks is at least 1,000 stacks/cm$^2$.

8. The photovoltaic cell of claim 1, wherein at least some of the graphene sheets are doped.

9. The photovoltaic cell of claim 8, wherein the doped graphene sheets are doped with two different dopants in two different segments to form p-n junctions.

10. The photovoltaic cell of claim 9, wherein the dopants terminate the edges of the graphene sheets.

11. The photovoltaic cell of claim 8, wherein the dopants terminate the edges of the graphene sheets.

12. The photovoltaic cell of claim 1, wherein all, or substantially all, of the graphene sheets are semiconducting.

13. The photovoltaic cell of claim 1, wherein the graphite stacks define a plurality of regions, each region comprising a plurality of graphite stacks having substantially identical widths and graphene sheets having substantially identical bandgaps, wherein each region is connected in series with at least one other region.

14. The photovoltaic cell of claim 13, wherein the graphite stacks in each region are spatially grouped.

15. The photovoltaic cell of claim 13, wherein the graphene sheets have bandgaps spanning the range of about 0.1 eV to about 2 eV.

16. The photovoltaic cells of claim 13, comprising at least three regions.

17. The photovoltaic cell of claim 1, wherein the junctions between the first electrically conductive contact material and the graphene sheets form Schottky barriers for electrons and junctions between the second electrically conductive material and the graphene sheets do not form Schottky barriers for electrons.

18. The photovoltaic cell of claim 1, wherein the junctions between the first electrically conductive material and the graphene sheets form Schottky barriers for electrons and junctions between the second electrically conductive material and the graphene sheets form Schottky barriers for electrons.

19. The photovoltaic cell of claim 1, wherein the junctions between the first electrically conductive material and the graphene sheets form Schottky barriers for electrons and junctions between the second electrically conductive material and the graphene sheets form Schottky barriers for holes.

20. The photovoltaic cell of claim 1, capable of producing a power density of at least about 50 W/m$^2$ without a solar concentrator.

21. The photovoltaic cell of claim 1, capable of producing a power density of at least about 5000 W/m$^2$ with a 100× solar concentrator.

22. A method for generating electricity comprising exposing the photovoltaic cell of claim 1 to radiation capable of photogenerating charge carriers in the graphene sheets, whereby electricity is produced.

23. The method of claim 22, wherein the radiation is solar radiation.

* * * * *